(12) United States Patent
Tsai et al.

(10) Patent No.: US 6,489,180 B1
(45) Date of Patent: Dec. 3, 2002

(54) FLIP-CHIP PACKAGING PROCESS UTILIZING NO-FLOW UNDERFILL TECHNIQUE

(75) Inventors: Ying Chou Tsai, Hsinchu (TW); Shih Kuang Chiu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 11 days.

(21) Appl. No.: 09/685,433

(22) Filed: Oct. 10, 2000

(51) Int. Cl.⁷ .................... H01L 21/44; H01L 21/48; H01L 21/50
(52) U.S. Cl. ............ 438/108; 438/1.18; 438/612; 438/974
(58) Field of Search ................... 438/108, 109, 438/118, 119, 612, 613, 614, 974

(56) References Cited

U.S. PATENT DOCUMENTS

| | | |
|---|---|---|
| 4,927,505 A | 5/1990 | Sharma et al. |
| 5,137,845 A | 8/1992 | Lochon et al. |
| 5,736,456 A | 4/1998 | Akram |
| 5,736,790 A | 4/1998 | Iyogi et al. |
| 5,858,149 A | 1/1999 | Seo et al. |
| 5,902,686 A | 5/1999 | Mis |
| 5,903,058 A | 5/1999 | Akram |
| 5,904,859 A | 5/1999 | Degani |
| 6,015,652 A | * 1/2000 | Ahlquist et al. |

* cited by examiner

*Primary Examiner*—Wael Faburyl
*Assistant Examiner*—D. M. Collins
(74) *Attorney, Agent, or Firm*—Peter F. Corless; Steven M. Jensen; Edwards & Angell, LLP

(57) ABSTRACT

A flip-chip packaging process is proposed, which can help assure reliable electrical bonding between chip-side solder bumps and substrate-side bond pads without being made open-circuited by the electrically-insulative material being used for flip chip underfill. The proposed flip-chip packaging process is of the type utilizing a no-flow underfill technique to prevent short-circuiting between neighboring solder bumps, and is characterized in the fabrication of electrically-conductive sharp-pointed studs over substrate-side bond pads to prevent open-circuiting between chip-side solder bumps and substrate-side bond pads. These electrically-conductive sharp-pointed studs can pierce into the chip-side solder bumps when mounting the flip chip onto the substrate, so that during subsequent solder-reflow process, the piercing of these sharp-pointed studs in the solder bumps can help allow the solder bumps to be reliably wetted to the substrate-side bond pads, thereby establishing reliable electrical bonding between the chip-side solder bumps and the substrate-side bond pads. The finished flip-chip device is therefore more assured in quality and reliability.

18 Claims, 4 Drawing Sheets

FLIP-CHIP PACKAGING PROCESS UTILIZING NO-FLOW UNDERFILL TECHNIQUE

BACKGROUND OF THE INVENTION

1. Field of the Invention

This invention relates to flip-chip packaging technology, and more particularly, to a flip-chip packaging process, which utilizes a no-flow underfill technique to help prevent neighboring solder bumps from being short-circuited to each other during solder-reflow, and which is characterized in the provision of sharp-pointed studs over substrate-side bond pads to help assure reliable electrical bonding between chip-side solder bumps and substrate-side bond pads without being made open-circuited by the electrically-insulative material being used for flip chip underfill.

2. Description of Related Art

The flip-chip technology is an advanced semiconductor fabrication technology that allows the overall package size to be made very compact. The flip-chip package configuration differs from conventional ones particularly in that it mounts the semiconductor chip in an upside-down manner over the chip carrier and electrically coupled to the same by means of solder bumps provided on the active surface of the semiconductor chip. Since no bonding wires are required, which would otherwise occupy much layout space, the overall size of the flip-chip package can be made very compact as compared to conventional types of semiconductor device packages.

After the flip chip is readily bonded in position, however, a gap would be undesirably left between the flip chip and the substrate. Since the chip and the substrate are typically different in coefficient of thermal expansion (CTE), if the gap is not underfilled, it would easily cause the flip chip to suffer from fatigue cracking and electrical failure due to thermal stress while undergoing high-temperature conditions during subsequent processes. As a solution to this problem, it is an essential step in flip-chip package fabrication to perform a flip-chip underfill process so as to fill an electrically-insulative material, such as epoxy resin, into the flip chip gap. The underfilled resin, when hardened, can serve as a mechanical reinforcement to the flip-chip construction to cope against thermal stress.

Conventionally, the flip-chip packaging process is performed in the following successive steps: (1) chip mounting; (2) solder reflow; and (3) dispensing underfill material. In this case, the underfill material is dispensed onto the substrate after the flip chip is readily mounted in position and the solder-reflow process is completed. The dispensed underfill material will then flow through capillary action into the gap under the flip chip.

However, by today's semiconductor fabrication technology, the pitch between neighboring solder bumps can be made very small; and consequently, the solder bumps during the solder-reflow step would easily come in touch with neighboring ones, making them short-circuited to each other. If any solder bumps are short-circuited, the finished flip-chip device would be regarded as defective. One solution to this problem is to use the so-called no-flow underfill technique, by which the underfill material is dispensed onto the substrate before the flip chip is mounted on the substrate. In this case, the flip-chip packaging process is performed in the following successive steps: (1) dispensing underfill material; (2) chip mounting; and (3) solder reflow. Since the pre-dispensed underfill material can provide an insulative effect to the solder bumps during the solder-reflow process, it can help prevent the solder bumps from being short-circuited to each other.

FIGS. 1A–1D are schematic sectional diagrams used to depict a conventional flip-chip packaging process which utilizes no-flow underfill technique to help prevent neighboring solder bumps from being short-circuited to each other during the solder-reflow process.

Referring to FIG. 1A, in the flip-chip packaging process, the first step is to prepare a semiconductor chip 110 and a substrate 120 for flip-chip application. The semiconductor chip 110 is formed with a plurality of solder bumps 111 over the active surface thereof, while the substrate 120 is formed with a plurality of corresponding bond pads 121 on the top surface thereof (note that FIG. 1A is simplified to show only the parts related to the invention; the actual semiconductor chip and substrate may include a great number of various other components).

The substrate-side bond pads 121 can be either SMD (Solder Mask Define) type, or NSMD (Non-SMD) type, or mixed SMD-NSMD type. These types of bond pads are all well-known in the semiconductor industry, so description thereof will not be further detailed.

Referring further to FIG. 1B, in the next step, an underfill material, such as epoxy resin, is dispensed over the top surface of the substrate 120 so as to form a no-flow underfill layer 130 over the top surface of the substrate 120, which covers all the substrate-side bond pads 121.

Referring further to FIG. 1C, in the next step, the semiconductor chip 110 is mounted in an upside-down (flip chip) manner onto the substrate 120, with the solder bumps 111 thereof being aligned respectively to the substrate-side bond pads 121. The semiconductor chip 110 is then forcibly pressed down so as to allow the solder bumps 111 to come into firm abutment on the substrate-side bond pads 121.

Undesirably, however, due to the existence of the previously formed no-flow underfill layer 130, the solder bumps 111 may not be reliably abutted on the substrate-side bond pads 121. In the case of FIG. 1C, for example, assume one of the solder bumps 111 is unabutted on the corresponding one of the substrate-side bond-pads 121, as the one indicated by the dotted circle 140.

Referring further to FIG. 1D, in the next step, a solder-reflow process is performed to reflow all the solder bumps 111 over the substrate-side bond pads 121. During this process, however, since the solder bump indicated by the dotted circuit 140 has been unabutted on its associated one of the substrate-side bond pads 121, it would be hardly wetted to the associated one of the substrate-side bond pads 121, thus undesirably making the electrical bonding therebetween failed to be reliably established.

Various patented technologies have been proposed for flip-chip applications. A few of these patented technologies are listed in the following:

U.S. Pat. No. 5,736,790 entitled "SEMICONDUCTOR CHIP, PACKAGE AND SEMICONDUCTOR DEVICE";

U.S. Pat. No. 5,858,149 entitled "PROCESS FOR BONDING SEMICONDUCTOR CHIP";

U.S. Pat. No. 5,904,859 entitled "FLIP CHIP METALLIZATION";

U.S. Pat. No. 5,902,686 entitled "METHODS FOR FORMING AN INTERMETALLIC REGION BETWEEN A SOLDER BUMP AND AN UNDER BUMP METALLURGY LAYER AND RELATED STRUCTURES";

U.S. Pat. No. 6,015,652 entitled "MANUFACTURE OF FLIP-CHIP DEVICE";

U.S. Pat. No. 5,137,845 entitled "METHOD OF FORMING METAL CONTACT PADS AND TERMINALS ON SEMICONDUCTOR CHIPS";

U.S. Pat. No. 5,773,359 entitled "INTERCONNECTION SYSTEM AND METHOD OF FABRICATION";

U.S. Pat. No. 5,736,456 entitled "METHOD OF FORMING CONDUCTIVE BUMPS ON DIE FOR FLIP CHIP APPLICATIONS";

U.S. Pat. No. 4,927,505 entitled "METALLIZATION SCHEME PROVIDING ADHESION AND BARRIER PROPERTIES";

U.S. Pat. No. 5,903,058 entitled "CONDUCTIVE BUMPS ON DIE FOR FLIP CHIP APPLICATION".

However, none of the above-listed patented technologies can help solve the aforementioned problem of unreliable electrical bonding between chip-side solder bumps and substrate-side bond pads when no-flow underfill technique is utilized.

SUMMARY OF THE INVENTION

It is therefore an objective of the invention to provide a flip-chip packaging process, which can help assure reliable electrical bonding between chip-side solder bumps and substrate-side bond pads.

In accordance with the foregoing and other objectives, the invention proposes an improved flip-chip packaging process.

Broadly recited, the flip-chip packaging process of the invention comprises the following procedural steps: (1) preparing a semiconductor chip and a substrate for flip-chip application; the semiconductor chip being formed with a plurality of solder bumps while the substrate being formed with a plurality of bond pads; (2) providing a plurality of electrically-conductive sharp-pointed studs respectively over the substrate-side bond pads; (3) dispensing an underfill material over the substrate so as to form a no-flow underfill layer which covers the substrate-side bond pads and the electrically-conductive sharp-pointed studs; (4) mounting the semiconductor chip in a flip chip manner onto the substrate, with the solder bumps thereon being aligned respective to the substrate-side bond pads and forcibly pressed down against the electrically-conductive sharp-pointed studs; and (5) performing a solder-reflow process to reflow the solder bumps over the substrate-side bond pads.

The foregoing flip-chip packaging process is characterized in the fabrication of the electrically-conductive sharp-pointed studs over the substrate-side bond pads. These electrically-conductive sharp-pointed studs can pierce into the chip-side solder bumps when mounting the flip chip onto the substrate, so that during subsequent solder-reflow process, the piercing of these sharp-pointed studs in the solder bumps can help allow the solder bumps to be reliably wetted to the substrate-side bond pads, thereby establishing reliable electrical bonding between the chip-side solder bumps and the substrate-side bonds pads. The finished flip-chip device is therefore more assured in quality and reliability.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF PREFERRED EMBODIMENTS

The improved flip-chip packaging process according to the invention is disclosed by way of preferred embodiments in full details in the following with reference to FIGS. 2A–2E, FIGS. 3A–3B, and FIGS. 4A–4C.

Figure 1A:
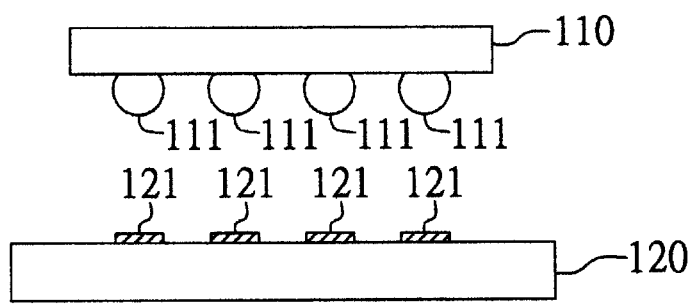
FIGS. 1A–1D (PRIOR ART) are schematic sectional diagrams used to depict a conventional flip-chip packaging process.
Figure 1B:
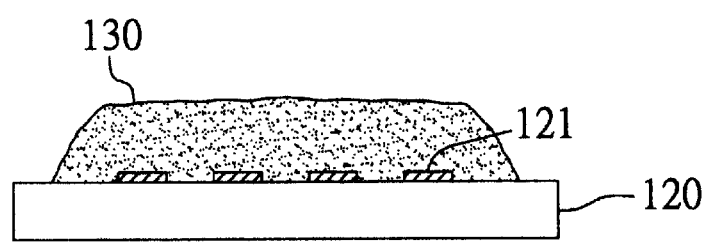
Figure 1C:
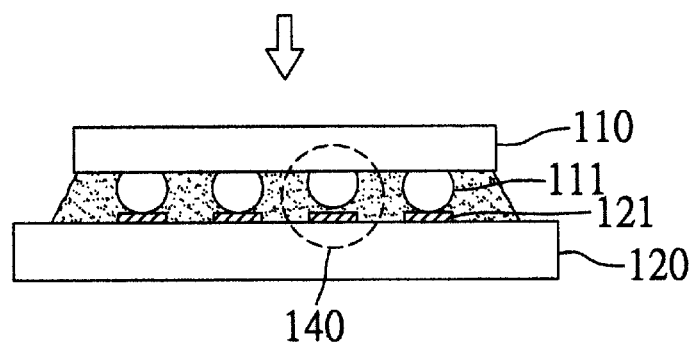
Figure 1D:
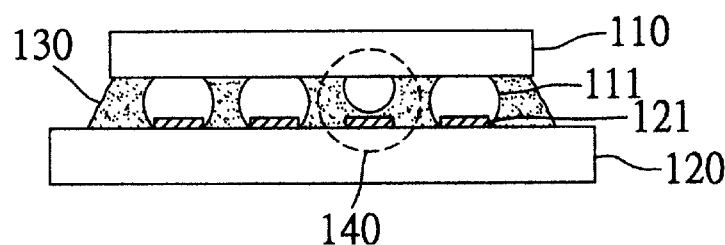
Figure 2A:
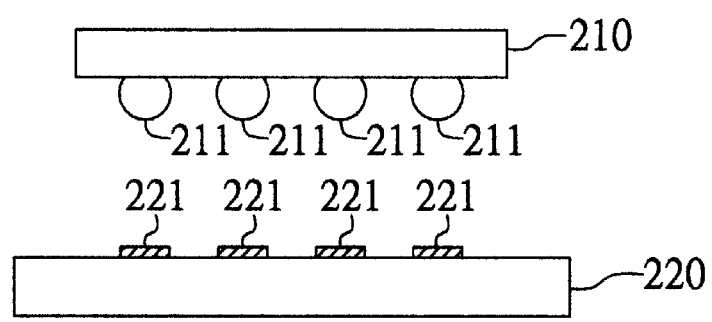
FIGS. 2A–2E are schematic sectional diagrams used to depict the flip-chip packaging process according to the invention.

Referring to FIG. 2A, in the flip-chip packaging process, the first step is to prepare a semiconductor chip 210 and a substrate 220 for flip-chip application. The semiconductor chip 210 is formed with a plurality of solder bumps 211 over the active surface thereof, while the substrate 220 is formed with a plurality of corresponding bond pads 221 on the top surface thereof (note that FIG. 2A is simplified to show only the parts related to the invention; the actual semiconductor chip and substrate may include a great number of various other components).

Figure 2B:
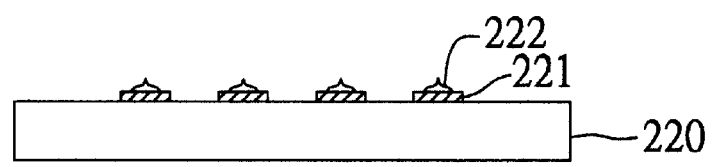

Referring further to FIG. 2B, in the next step, it is a characteristic feature of the invention that a plurality of electrically-conductive sharp-pointed studs 222 are fabricated respectively over the bond pads 221. These sharp-pointed studs 222 can be fabricated through various methods, such as through the use of existing wire-bonding equipment depicted in the following with reference to FIGS. 3A–3B.

Figure 3A:
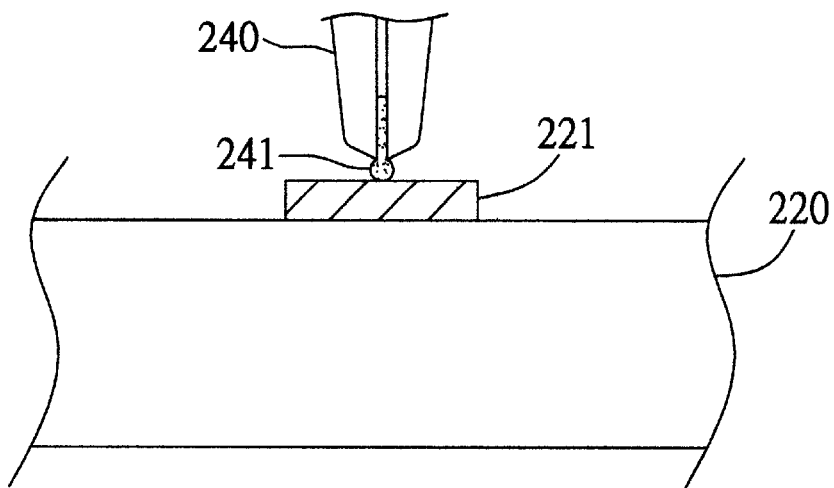
FIGS. 3A–3B are schematic diagrams used to depict the fabrication of an electrically-conductive sharp-pointed stud over a substrate-side bond pad.
Figure 3B:
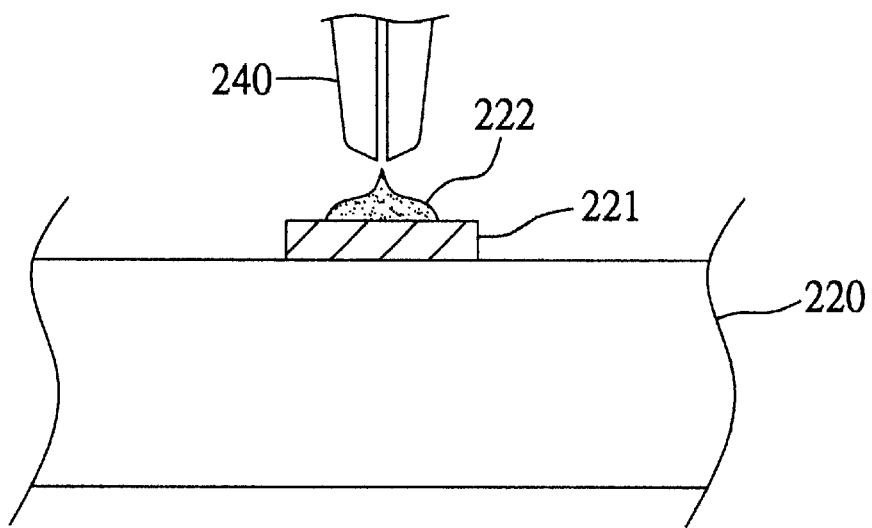

As shown in FIG. 3A, each sharp-pointed stud 222 can be fabricated through the use of a capillary needle 240, which is a piece of existing wire-bonding equipment, to apply a predetermined small amount of an electrically-conductive material 241, such as gold, onto each substrate-side bond pad 221. As further shown in FIG. 3B, since the electrically-conductive material 241 is applied in small amount, it is formed into a sharp-pointed stud 222 rather than into a wire connected to another bond pad.

Figure 4A:
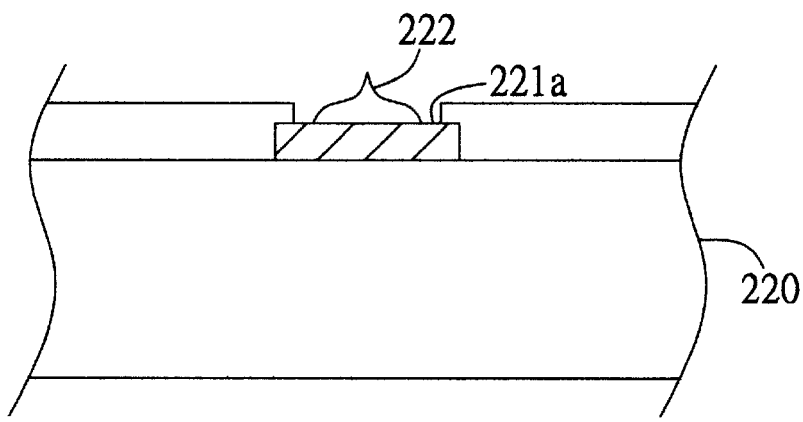
FIGS 4A–4C are schematic diagrams used to depict various types of bond pads on substrate over which an electrically-conductive sharp-pointed stud can be fabricated.
Figure 4B:
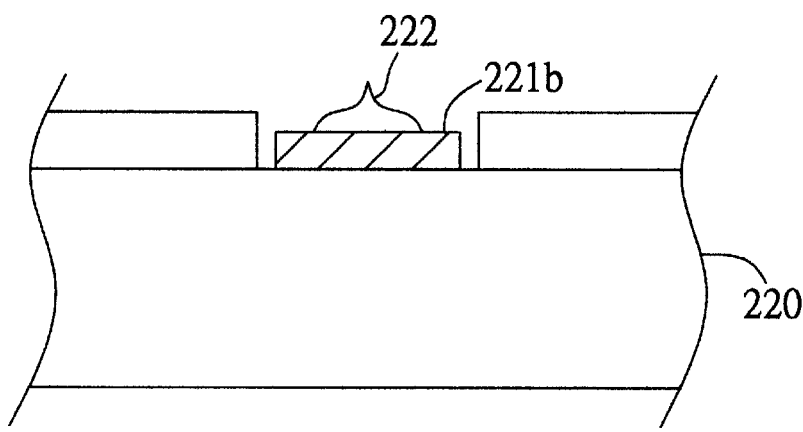
Figure 4C:
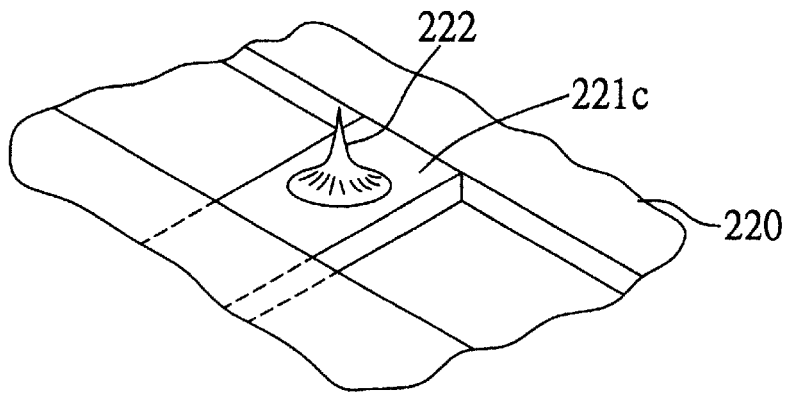

The sharp-pointed studs 222 can be fabricated over various types of bond pads made of an electrically-conductive material bondable to the material being used to fabricate the sharp-pointed studs 222. FIG. 4A shows the case of the sharp-pointed stud 222 being fabricated over a copper-made SMD type of bond pad 221a. FIG. 4B shows the case of the sharp-pointed stud 222 being fabricated over a copper-made NSMD type of bond pad 221b. FIG. 4C shows the case of the sharp-pointed stud 222 being fabricated over a copper-made mixed SMD-NSMD type of bond pad 221c. The SMD, NSMD, and mixed SMD-NSMD types of bond pads are well-known in the semiconductor industry, so description thereof will not be further detailed.

Figure 2C:
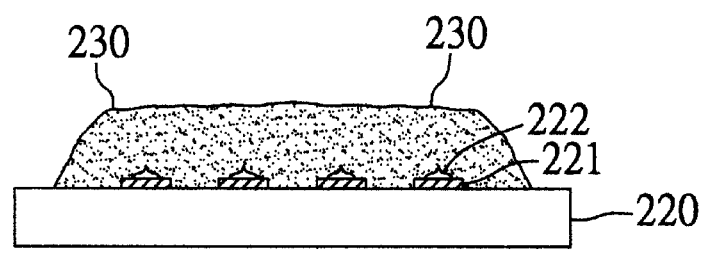

Referring further to FIG. 2C, in the next step, an underfill material, such as epoxy resin, is dispensed over the top surface of the substrate 220 so as to form a no-flow underfill layer 230 over the top surface of the substrate 220, which covers all the substrate-side bond pads 221 and the sharp-pointed studs 222.

Figure 2D:
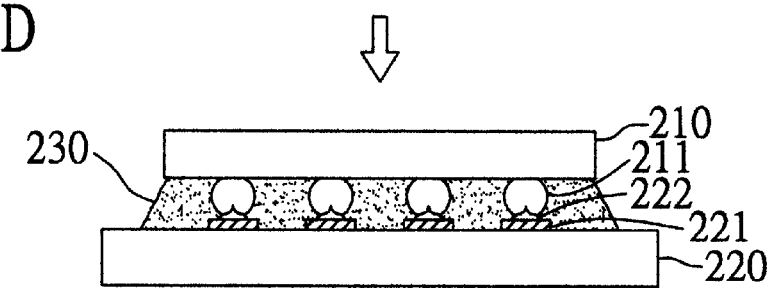

Referring further to FIG. 2D, in the next step, the semiconductor chip 210 is mounted in an upside-down (flip chip) manner onto the substrate 220, with the solder bumps 211 thereof being aligned respectively to the substrate-side bond pads 221. The semiconductor chip 210 is then forcibly pressed down against the substrate 220 so as to allow the sharp-pointed studs 222 to pierce into the respective solder bumps 211.

Figure 2E:
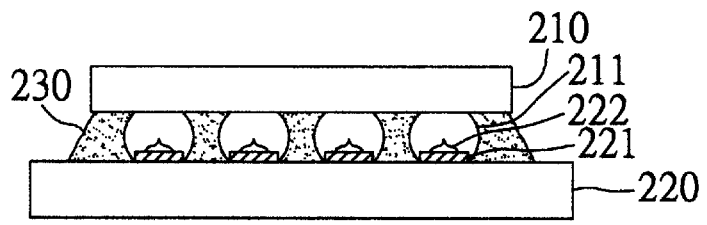

Referring further to FIG. 2E, in the next step, a solder-reflow process is performed to reflow the solder bumps 211 over the substrate-side bond pads 221. Thanks to the provision of the sharp-pointed studs 222, the solder bumps 211 during reflow can be substantially all wetted to the respective substrate-side bond pads 221, thereby establishing reliable electrical bonding between the solder bumps 211 and the substrate-side bond pads 211.

In conclusion, the invention provides an improved flip-chip packaging process which is characterized in the fabrication of electrically-conductive sharp-pointed studs over the substrate-side bond pads. These electrically-conductive sharp-pointed studs can pierce into the chip-side solder bumps when mounting the flip chip onto the substrate, so that during subsequent solder-reflow process, the piercing of these sharp-pointed studs in the solder bumps can help allow the solder bumps to be reliably wetted to the substrate-side bond pads, thereby establishing reliable electrical bonding between the chip-side solder bumps and the substrate-side bond pads. The finished flip-chip device is therefore more assured in quality and reliability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip-chip packaging process, comprising the steps of:
   (1) preparing a semiconductor chip and a substrate for flip-chip application; the semiconductor chip being formed with a plurality of solder bumps while the substrate being formed with a plurality of bond pads;
   (2) providing a plurality of electrically-conductive sharp-pointed studs respectively over the substrate-side bond pads;
   (3) dispensing an underfill material over the substrate so as to form a no-flow underfill layer which covers the substrate-side bond pads and the electrically-conductive sharp-pointed studs;
   (4) mounting the semiconductor chip in a flip chip manner onto the substrate, with the solder bumps thereon being aligned respective to the substrate-side bond pads and forcibly pressed down against the electrically-conductive sharp-pointed studs; and
   (5) performing a solder-reflow process to reflow the solder bumps over the substrate-side bond pads.

2. The flip-chip packaging process of claim 1, wherein in said step (1), the substrate-side bond pads are SMD type.

3. The flip-chip packaging process of claim 1, wherein in said step (1), the substrate-side bond pads are NSMD type.

4. The flip-chip packaging process of claim 1, wherein in said step (1), the substrate-side bond pads are mixed SMD-NSMD type.

5. The flip-chip packaging process of claim 1, wherein in said step (2), the electrically-conductive sharp-pointed studs are fabricated through the use of wire-bonding equipment which applies a predetermined amount of an electrically-conductive material onto each of the substrate-side bond pads.

6. The flip-chip packaging process of claim 5, wherein in said step (2), the electrically-conductive material being used to fabricate the electrically-conductive sharp-pointed studs is gold.

7. The flip-chip packaging process of claim 1, wherein in said step (3), the underfill material being used to form the no-flow underfill layer is epoxy resin.

8. A flip-chip packaging process, comprising the steps of:
   (1) preparing a semiconductor chip and a substrate for flip-chip application; the semiconductor chip being formed with a plurality of solder bumps while the substrate being formed with a plurality of bond pads;
   (2) providing a plurality of electrically-conductive sharp-pointed studs respectively over the substrate-side bond pads through the use of wire-bonding equipment which applies a predetermined amount of an electrically-conductive material onto each of the substrate-side bond pads;
   (3) dispensing an underfill material over the substrate so as to form a no-flow underfill layer which covers the substrate-side bond pads and the electrically-conductive sharp-pointed studs;
   (4) mounting the semiconductor chip in a flip chip manner onto the substrate, with the solder bumps thereon being aligned respective to the substrate-side bond pads and forcibly pressed down against the electrically-conductive sharp-pointed studs; and
   (5) performing a solder-reflow process to reflow the solder bumps over the substrate-side bond pads.

9. The flip-chip packaging process of claim 8, wherein in said step (1), the substrate-side bond pads are SMD type.

10. The flip-chip packaging process of claim 8, wherein in said step (1), the substrate-side bond pads are NSMD type.

11. The flip-chip packaging process of claim 8, wherein in said step (1), the substrate-side bond pads are mixed SMD-NSMD type.

12. The flip-chip packaging process of claim 8, wherein in said step (2), the electrically-conductive material being used to fabricate the electrically-conductive sharp-pointed studs is gold.

13. The flip-chip packaging process of claim 8, wherein in said step (3), the underfill material being used to form the no-flow underfill layers is epoxy resin.

14. A flip-chip packaging process, comprising the steps of:
   (1) preparing a semiconductor chip and a substrate for flip-chip application; the semiconductor chip being formed with a plurality of solder bumps while the substrate being formed with a plurality of bond pads;
   (2) providing a plurality of electrically-conductive sharp-pointed studs respectively over the substrate-side bond pads through the use of wire-bonding equipment which applies a predetermined amount of gold onto each of the substrate-side bond pads;

(3) dispensing an underfill material over the substrate so as to form a no-flow underfill layer which covers the substrate-side bond pads and the electrically-conductive sharp-pointed studs;

(4) mounting the semiconductor chip in a flip chip manner onto the substrate, with the solder bumps thereon being aligned respective to the substrate-side bond pads and forcibly pressed down against the electrically-conductive sharp-pointed studs; and (5) performing a solder-reflow process to reflow the solder bumps over the substrate-side bond pads.

15. The flip-chip packaging process of claim 14, wherein in said step (1), the substrate-side bond pads are SMD type.

16. The flip-chip packaging process of claim 14, wherein in said step (1), the substrate-side bond pads are NSMD type.

17. The flip-chip packaging process of claim 14, wherein in said step (1), the substrate-side bond pads are mixed SMD-NSMD type.

18. The flip-chip packaging process of claim 14, wherein in said step (3), the underfill material being used to form the no-flow underfill layer is epoxy resin.

* * * * *